United States Patent
Yang

(10) Patent No.: US 6,817,486 B2
(45) Date of Patent: Nov. 16, 2004

(54) PHOTORESIST SUPPLY APPARATUS CAPABLE OF CONTROLLING FLOW LENGTH OF PHOTORESIST AND METHOD OF SUPPLYING PHOTORESIST USING THE SAME

(75) Inventor: Myung-Hun Yang, Cheonan (KR)

(73) Assignee: Nano Fa Co., Ltd., Hwaseong (KR)

( * ) Notice: Subject to any disclaimer, the term of this patent is extended or adjusted under 35 U.S.C. 154(b) by 140 days.

(21) Appl. No.: 10/237,888

(22) Filed: Sep. 10, 2002

(65) Prior Publication Data

US 2003/0047136 A1 Mar. 13, 2003

(30) Foreign Application Priority Data

Sep. 11, 2001 (KR) .......................................... 2001-55913

(51) Int. Cl.⁷ ................................................ B67D 5/08
(52) U.S. Cl. ............................... 222/55; 222/1; 222/63; 222/135; 118/684
(58) Field of Search ................................ 222/504, 420, 222/135–136, 52, 55, 56, 53, 1, 63, 189.06, 189.11, 383.1, 14; 118/684, 52, 710, 713

(56) References Cited

U.S. PATENT DOCUMENTS

| | | | | |
|---|---|---|---|---|
| 4,601,409 A | * | 7/1986 | DiRegolo | 222/1 |
| 5,042,688 A | * | 8/1991 | Srivastava et al. | 222/55 |
| 5,383,574 A | * | 1/1995 | Raphael | 222/1 |
| 5,636,762 A | * | 6/1997 | Juhola et al. | 222/1 |
| 5,985,357 A | * | 11/1999 | Sanada | 427/8 |
| 6,012,607 A | * | 1/2000 | Hsu et al. | 222/52 |
| 6,139,639 A | * | 10/2000 | Kitamura et al. | 118/680 |
| 6,213,354 B1 | * | 4/2001 | Kay | 222/420 |
| 6,269,975 B2 | * | 8/2001 | Soberanis et al. | 222/1 |
| 6,319,317 B1 | * | 11/2001 | Takamori | 118/52 |
| 6,680,078 B2 | * | 1/2004 | Davlin et al. | 427/8 |

* cited by examiner

Primary Examiner—Fredrick C. Nicolas
(74) Attorney, Agent, or Firm—Rothwell, Figg, Ernst & Manbeck

(57) ABSTRACT

A photoresist supply apparatus and a method of supplying photoresist using the same are provided. The photoresist supply apparatus includes a flow length measurer for measuring the flow length of photoresist remaining at the tip of a nozzle unit; a measured data processor for converting data measured by the flow length measurer into an electrical signal; and a valve controller for finely controlling the flow length of photoresist by controlling the amount of air flowing into an automatic on/off valve in response to the electrical signal fed back from the measured data processor. Accordingly, by measuring the flow length of photoresist at the tip of nozzle unit in real time and feeding back the measured flow length, a faulty process due to an irregular flow length of photoresist can be prevented, and a fixed amount of photoresist can be ejected.

5 Claims, 4 Drawing Sheets

PHOTORESIST SUPPLY APPARATUS CAPABLE OF CONTROLLING FLOW LENGTH OF PHOTORESIST AND METHOD OF SUPPLYING PHOTORESIST USING THE SAME

CROSS-REFERENCE TO RELATED APPLICATIONS

This application is based upon and claims priority from Korean Patent Application No. 01-55913 filed Sep. 11, 2001, the contents of which are incorporated herein by reference.

BACKGROUND OF THE INVENTION

1. Field of the Invention

The present invention relates to apparatus and method for supplying photoresist, and more particularly, to a photoresist supply apparatus capable of controlling the flow length of photoresist, and a method of supplying photoresist using the same.

2. Description of the Related Art

Generally, a lithography process is performed during manufacture of integrated circuit (IC) semiconductor devices in order to form a pattern on a particular layer of a semiconductor wafer. The lithography process is performing exposure and development after photoresist is deposited on a semiconductor wafer. Accordingly, in order to deposit photoresist on a semiconductor wafer, a photoresist supply apparatus for supplying photoresist over the semiconductor wafer is required.

In the meantime, as the degree of integration of IC semiconductor devices increases, it is increasingly necessary to very precisely control the ejected amount and pressure of photoresist that is supplied on a semiconductor wafer. However, in conventional photoresist supply apparatuses, the amount and pressure of photoresist continuously ejected over a semiconductor wafer may not correct due to various causes such as changes in the pressure of a pump for supplying photoresist, i.e., a blocked-up photoresist filter and a change in the pressure of air supplied for turning on/off a valve.

When the amount and pressure of photoresist ejected over a semiconductor wafer incorrectly change, the flow length of photoresist remaining at a nozzle unit frequently changes. In addition, when exposure and development processes are performed under the state in which the photoresist flow length at the nozzle unit changes, particles occur in the surface of a semiconductor wafer after the exposure and development processes. In the worst cases, deposition of photoresist and an exposure process must be performed again, or the semiconductor wafer must be discarded.

SUMMARY OF THE INVENTION

To solve the above-described problems, it is a first object of the present invention to provide a photoresist supply apparatus capable of continuously and precisely controlling the interrupt of photoresist ejected over a semiconductor wafer by measuring the flow length of photoresist remaining at a nozzle unit.

It is a second object of the present invention to provide a method of supplying photoresist using the above photoresist supply apparatus.

To achieve the first object of the present invention, a photoresist supply apparatus includes a photoresist supply unit for supplying photoresist; an automatic on/off valve connected to the photoresist supply unit, for controlling the flow of photoresist supplied from the photoresist supply unit; and a nozzle unit connected to the automatic on/off valve, for ejecting photoresist over a wafer. The automatic on/off valve may be composed of a cut-off valve and a suckback valve.

In addition, the photoresist supply apparatus includes a photoresist flow length measurer for measuring the flow length of photoresist remaining at a tip of the nozzle unit after interrupt of ejection through the nozzle unit; a measured data processor for converting data measured by the photoresist flow length measurer into an electrical signal; and a valve controller for finely controlling the flow length of photoresist remaining at the nozzle unit in response to the electrical signal fed back from the measured data processor. The photoresist flow length measurer may be manifested as a camera. The data measured by the photoresist flow length measurer may be an image signal. The valve controller may be manifested as a speed controller which controls the amount of air flowing into the automatic on/off valve. The speed controller may be composed of a stepping motor and an air control unit, which is connected to the stepping motor and controls the amount of air discharging into the automatic on/off valve.

To achieve the second object of the present invention, a method of supplying photoresist includes supplying photoresist to a nozzle unit through an automatic on/off valve. After interrupting photoresist supply to the nozzle unit by turning off the automatic on/off valve, the flow length of photoresist remaining at a tip of the nozzle unit is measured. The flow length of photoresist may be measured using a camera. After converting the measured flow length of photoresist into an electrical signal, the electrical signal is fed back to the valve controller, and the flow length of photoresist is finely controlled based on the electrical signal. The valve controller can finely control the flow length of photoresist by controlling the amount of air flowing into the automatic on/off valve. The valve controller may be manifested as a speed controller.

The above-described present invention measures the flow length of photoresist remaining at the nozzle unit and continuously and precisely controls the flow length of photoresist remaining after being ejected over a semiconductor wafer, thereby maintaining the flow length of photoresist consistent.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Hereinafter, embodiments of the present invention will be described in detail with reference to the attached drawings.

The present invention is not restricted to the following embodiments, and many variations are possible within the sprit and scope of the present invention. The embodiments of the present invention are provided in order to more completely explain the present invention to anyone skilled in the art.

Figure 1:
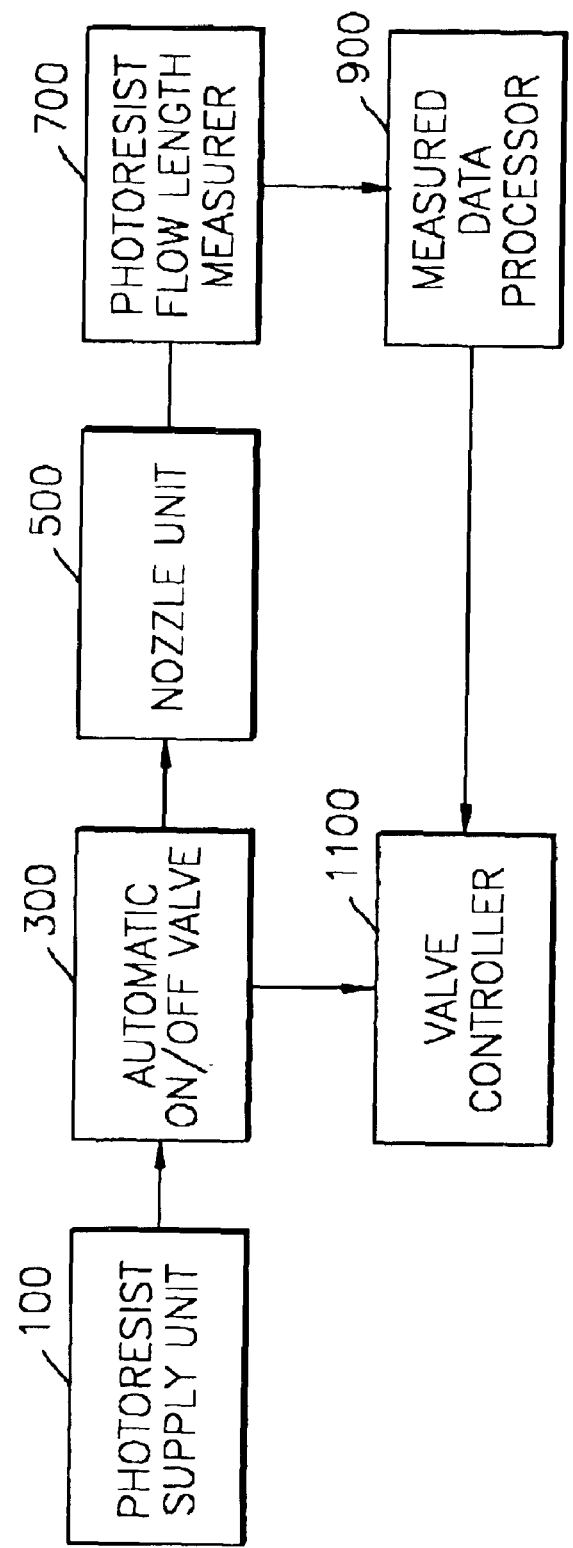
FIG. 1 is a block diagram for explaining the concept of a photoresist supply apparatus according to the present invention.

FIG. 1 is a block diagram for explaining the concept of a photoresist supply apparatus according to the present invention. Referring to FIG. 1, a photoresist supply apparatus according to the present invention includes a photoresist supply unit 100 for supplying photoresist. An automatic on/off valve 300 is connected to the photoresist supply unit 100 in order to control the flow of the supplied photoresist. The automatic on/off valve 300 is connected to a nozzle unit 500 for ejecting the supplied photoresist over a semiconductor wafer.

Further, a photoresist flow length measurer 700 is provided to measure a flow length of photoresist remaining at the tip of the nozzle unit 500 after the ejection of photoresist is stopped. The photoresist flow length measurer 700 is connected to a measured data processor 900 for converting measured data received from the photoresist flow length measurer 700 into an electrical signal. The photoresist supply apparatus also includes a valve controller 1100 for finely controlling the flow length of photoresist remaining at the nozzle unit 500 using the electrical signal fed back from the measured data processor 900.

Figure 2:
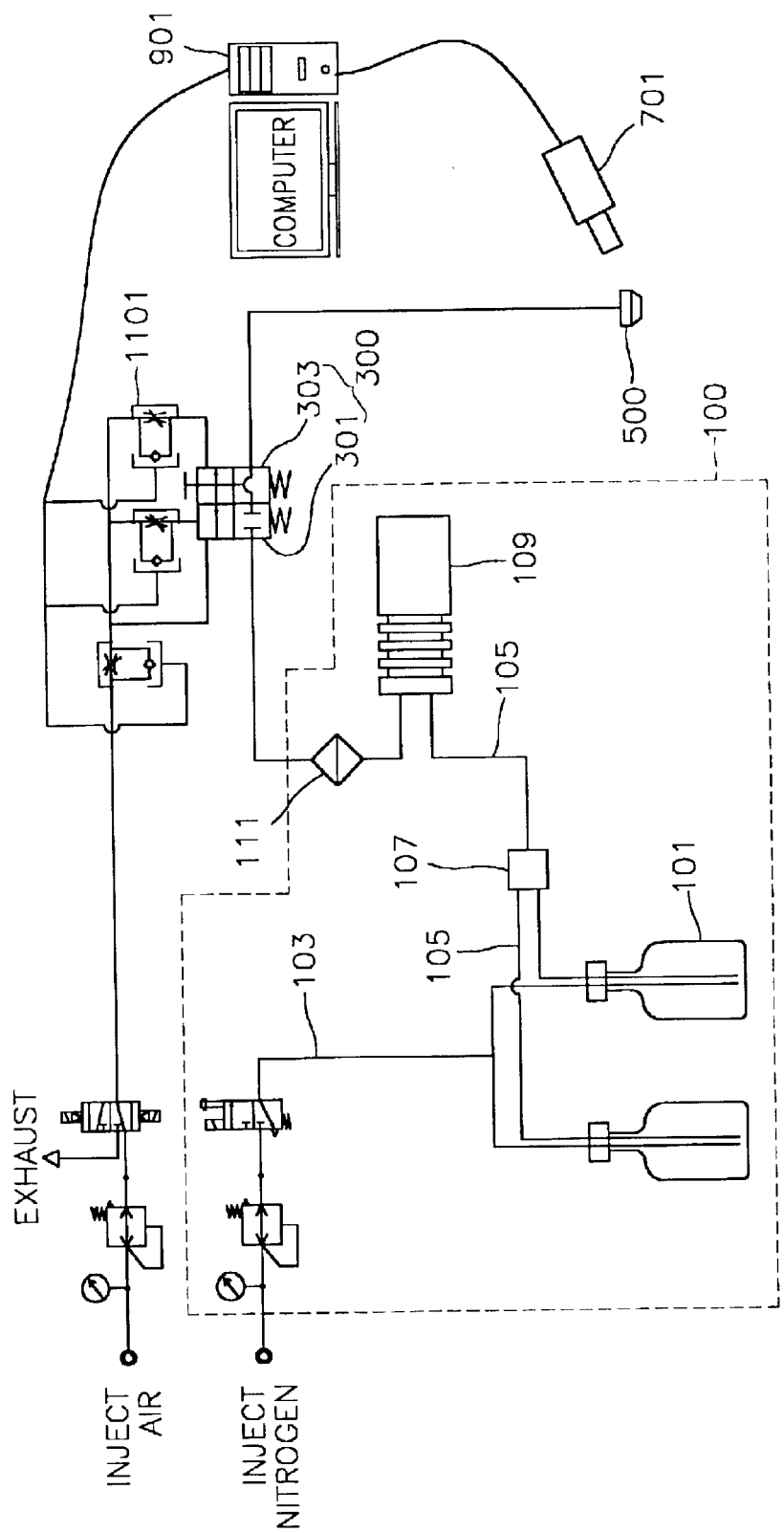
FIG. 2 is a schematic diagram of an embodiment of the photoresist supply apparatus shown in FIG. 1.

FIG. 2 is a schematic diagram of an embodiment of the photoresist supply apparatus shown in FIG. 1. Referring to FIG. 2, in the embodiment of the present invention, the photoresist supply apparatus includes the photoresist supply unit 100, like the photoresist supply apparatus shown in FIG. 1. The photoresist supply unit 100 includes a plurality of storage tanks 101 for storing photoresist to be ejected; a nitrogen injection line 103 for injecting nitrogen into each storage tank 101; a plurality of photoresist supply lines 105, which are connected to the respective storage tanks 101; and a switching valve 107 which is connected to the photoresist supply lines 105 in order to select one among the storage tanks 101. Photoresist is supplied from a certain storage tank 101 according to the operation of the switching valve 107. In addition, the photoresist supply unit 100 includes a photoresist pump 109, which sucks photoresist stored in the selected storage tank 101 and pressurizes the photoresist so that the photoresist can be ejected through the photoresist supply line 105, and a filter 111, which is connected to the photoresist pump 109 in order to remove impurities from the photoresist supplied from the photoresist pump 109.

The photoresist supply line 105 at the rear end of the filter 111 of the photoresist supply unit 100 is connected to an automatic on/off valve 300 for controlling the flow of the supplied photoresist. The automatic on/off valve 300 is composed of a cut-off valve 301 and a suckback valve 303. The cut-off valve 301 interrupts or flows the pressurized photoresist. The suck back valve 303 sucks a predetermined amount of photoresist remaining at the tip of a nozzle unit 500 after ejection of photoresist in order to prevent the photoresist from dropping.

Photoresist passing through the automatic on/off valve 300 is ejected via the nozzle unit 500 over a semiconductor wafer (not shown). Here, as described above, photoresist irregularly remains at and suspends from the tip of the nozzle unit 500 after ejection of photoresist. Although the suckback valve 303 can prevent the photoresist from dropping, it cannot precisely control the flow length of remaining photoresist. Accordingly, the photoresist supply apparatus according to the embodiment of the present invention includes a camera 701 which is installed near to the nozzle unit 500 to measure the flow length of photoresist remaining at the tip of the nozzle unit 500. The camera 701 is used as the flow length measurer 700 shown in FIG. 1.

The camera 701 is connected to a computer 901 which converts data measured by the camera 701, that is, an image signal, into an electrical signal. The computer 901 is used as the measured data processor 900 shown in FIG. 1. A speed controller 1101 finely controls the flow length of photoresist at the nozzle unit 500 by controlling the amount of air flowing into the automatic on/off valve 301 in response to the electrical signal fed back from the computer 901. The speed controller 1101 is used as the valve controller 1100 shown in FIG. 1. The speed controller 1101 is composed of a stepping motor and an air control unit, which is connected to the stepping motor and controls the amount of air discharging into the automatic on/off valve 300. The relationship between the speed controller 1101 and the automatic on/off valve 300 is described in detail with reference to FIG. 3.

Figure 3:
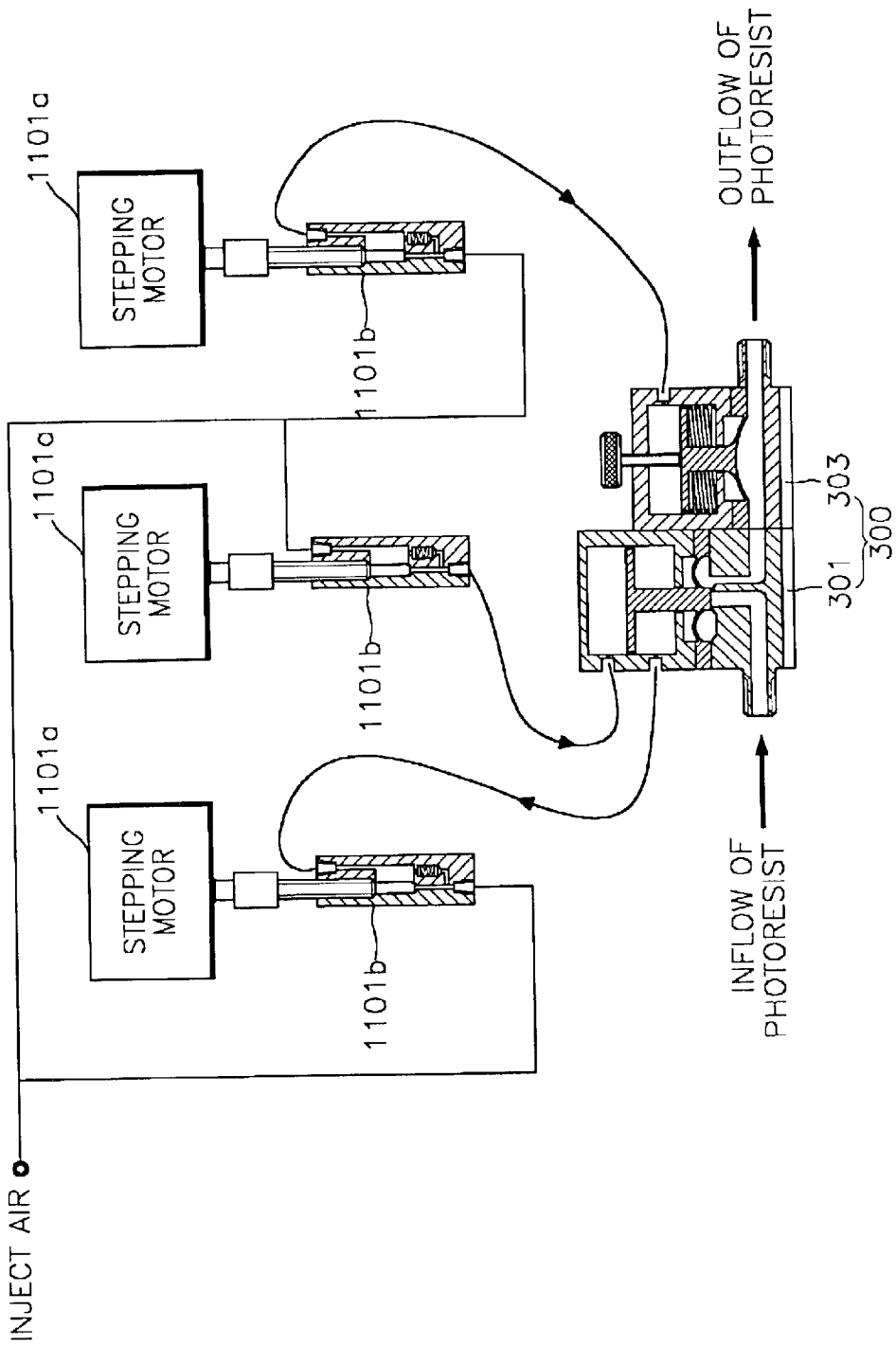
FIG. 3 is a diagram for explaining the air flow between the speed controller and the automatic on/off valve shown in FIG. 2.

FIG. 3 is a diagram for explaining the air flow between the speed controller and the automatic on/off valve shown in FIG. 2. Referring to FIG. 3, an electrical signal generated from the computer 901 shown in FIG. 2, i.e., the measured data processor 900 shown in FIG. 1 is fed back to a stepping motor 1101a of the speed controller 1101. More specifically, an electrical signal generated from the computer 901 with respect to the flow length of photoresist is fed back to a driving circuit (not shown) of the stepping motor 1101a in real time. In response to the electrical signal fed back in real time, the stepping motor 1101a finely rotates in real time so that a air control unit 1101b connected to the stepping motor 1101a externally controls the amount of air flowing into the automatic on/off valve 300, i.e., the cut-off valve 301 and the suckback valve 303. The air control unit 1101b has a hole in its cylinder connected to the stepping motor 1101a so that it can control the amount of air by flowing or blocking the air during rotation. Consequently, by finely controlling the amount of air flowing into the automatic on/off valve 300 in real time, the flow length of photoresist remaining at the nozzle unit 500 after ejection can be controlled in real time.

Figure 4:
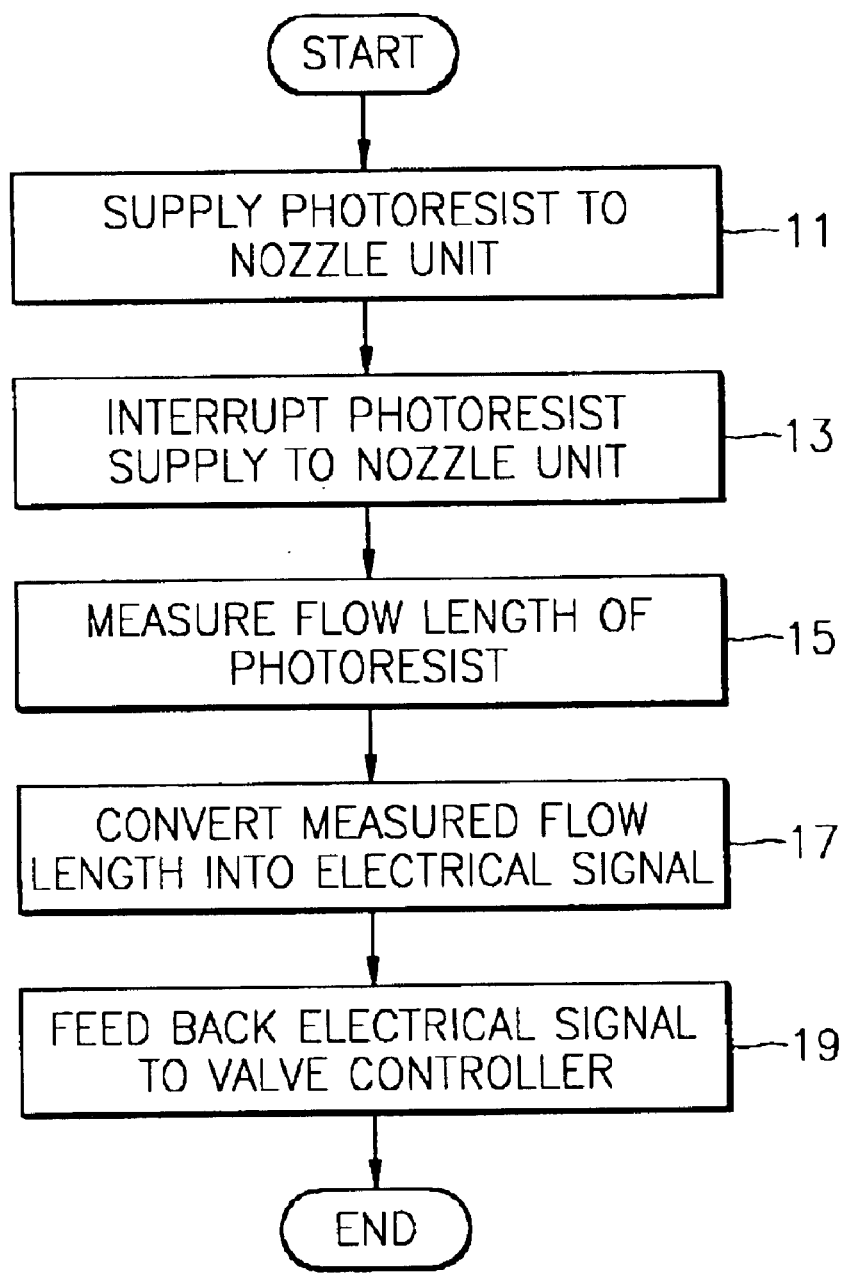
FIG. 4 is a flowchart of a method of supplying photoresist according to an embodiment of the present invention.

FIG. 4 is a flowchart of a method of supplying photoresist according to an embodiment of the present invention. Referring to FIG. 4, photoresist is supplied to a nozzle unit through an automatic on/off valve in step 11. Supply of photoresist has been described with reference to FIG. 2, and thus detailed description thereof will be omitted. Next, the automatic on/off valve is turned off to interrupt photoresist supply to the nozzle unit in step 13. Then, photoresist remains at the tip of the nozzle unit.

Thereafter, the flow length of photoresist remaining at the tip of the nozzle unit is measured in step 15. The flow length of photoresist can be measured using a camera. Subsequently, the measured flow length of photoresist is converted into an electrical signal in step 17. The conversion can be performed using a computer.

Next, the electrical signal is fed back to a valve controller to finely control the flow length of photoresist remaining at the nozzle unit in step 19. The valve controller may be manifested as a speed controller. The speed controller can finely control the flow length of photoresist by controlling the amount of air flowing into the automatic on/off valve.

As described above, a photoresist supply apparatus according to the present invention includes a flow length measurer for measuring the flow length of photoresist remaining at the tip of a nozzle unit; a measured data processor for converting data measured by the flow length measurer into an electrical signal; and a valve controller for finely controlling the flow length of photoresist by controlling the amount of air flowing into an automatic on/off valve in response to the electrical signal fed back from the measured data processor. Accordingly, by measuring the flow length of photoresist at the tip of nozzle unit in real time and feeding back the measured flow length, the flow length of photoresist can be continuously controlled in real time so that a faulty process due to an irregular flow length can be completely removed.

What is claimed is:

1. A photoresist supply apparatus comprising:

a photoresist supply unit for supplying photoresist;

an automatic on/off valve connected to the photoresist supply unit, for controlling the flow of photoresist supplied from the photoresist supply unit;

a nozzle unit connected to the automatic on/off valve, for ejecting photoresist;

a photoresist flow length measurer for measuring a flow length of photoresist remaining at a tip of the nozzle unit after interrupt of ejection through the nozzle unit;

a measured data processor for converting data measured by the photoresist flow length measurer into an electrical signal; and a valve controller for finely controlling the flow length of photoresist remaining at the nozzle unit in response to the electrical signal fed back from the measured data processor, wherein the valve controller is comprised of a speed controller that comprises a stepping motor and an air control unit which is connected to the stepping motor and controls the amount of air discharging, to thereby control the amount of air flowing into the automatic on/off valve.

2. The photoresist supply apparatus of claim 1, wherein the photoresist flow length measurer is a camera.

3. The photoresist supply apparatus of claim 1, wherein the data measured by the photoresist flow length measurer is an image signal.

4. A method of supplying photoresist comprising:

supplying photoresist to a nozzle unit through an automatic on/off valve;

interrupting photoresist supply to the nozzle unit by turning off the automatic on/off valve;

measuring a flow length of photoresist remaining at a tip of the nozzle unit;

converting the measured flow length of photoresist into an electrical signal; and feeding back the electrical signal to the valve controller comprised of a speed controller that comprises a stepping motor and an air control unit which is connected to the stepping motor and controls the amount of air discharging, to thereby control the amount of air flowing into the automatic on/off valve, and finely controlling the flow length of photoresist based on the electrical signal.

5. The method of claim 4, wherein the flow length of photoresist at the tip of the nozzle unit is measured using a camera.

* * * * *